(12) United States Patent
Katayama et al.

(10) Patent No.: US 12,288,973 B2
(45) Date of Patent: Apr. 29, 2025

(54) BUS BAR COOLING STRUCTURE

(71) Applicant: TOYOTA JIDOSHA KABUSHIKI KAISHA, Toyota (JP)

(72) Inventors: Masaaki Katayama, Tokyo (JP); Atsushi Hayashi, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 227 days.

(21) Appl. No.: 18/083,076

(22) Filed: Dec. 16, 2022

(65) Prior Publication Data
US 2023/0268728 A1    Aug. 24, 2023

(30) Foreign Application Priority Data
Feb. 24, 2022    (JP) .................................. 2022-026899

(51) Int. Cl.
*H02G 5/10*    (2006.01)
*H05K 7/20*    (2006.01)

(52) U.S. Cl.
CPC ........... *H02G 5/10* (2013.01); *H05K 7/20445* (2013.01)

(58) Field of Classification Search
CPC ............................. H02G 5/10; H05K 7/20445
USPC ........................................................ 174/68.2
See application file for complete search history.

(56) References Cited

U.S. PATENT DOCUMENTS

2022/0165490 A1*    5/2022    Bang ..................... H01F 27/427

FOREIGN PATENT DOCUMENTS

| JP | 2006-271063 A | 10/2006 |
| JP | 2014-060304 A | 4/2014 |
| JP | 2020-511782 A | 4/2020 |

* cited by examiner

*Primary Examiner* — Tremesha W Burns
(74) *Attorney, Agent, or Firm* — Oliff PLC

(57) ABSTRACT

A bus bar cooling structure includes: a plurality of bus bars; and an insulating cooling portion provided so as to be in contact with a part of each of the plurality of bus bars, current paths of the plurality of bus bars having different length from start points to end points of the current paths, a contact area between each bus bar and the cooling portion being set to an area proportional to a length of the bus bar.

7 Claims, 10 Drawing Sheets

FIG.7

ADVANTAGEOUS RANGE OF
STRUCTURE STACKED IN Z-DIRECTION

|  | NUMBER OF BUS BARS [pcs] | | |
|---|---|---|---|
| CURRENT VALUE [A] | 2 | 4 | 6 |
| 100 | EXCELLENT | EXCELLENT | EXCELLENT |
| 200 | FAIR | EXCELLENT | EXCELLENT |
| 300 | FAIR | EXCELLENT | EXCELLENT |
| 400 | FAIR | EXCELLENT | EXCELLENT |
| 500 | FAIR | EXCELLENT | EXCELLENT |
| 600 | FAIR | EXCELLENT | EXCELLENT |
| 700 | FAIR | FAIR | EXCELLENT |
| 800 | FAIR | FAIR | EXCELLENT |
| 900 | FAIR | FAIR | EXCELLENT |
| 1000 | FAIR | FAIR | EXCELLENT |

BUS BAR COOLING STRUCTURE

The present application claims priority to and incorporates by reference the entire contents of Japanese Patent Application No. 2022-026899 filed in Japan on Feb. 24, 2022.

BACKGROUND

The present disclosure relates to a bus bar cooling structure.

JP 2014-060304 discloses a cooling structure in which heat generated in a semiconductor element inside a semiconductor module is transferred to a cooling plate and radiated by the cooling plate. In this cooling structure, a bus bar connected to the semiconductor element extends to an outside from the semiconductor module, and a heat transfer plate for transferring heat of the bus bar to the cooling plate extends from the cooling plate, and a tip of the heat transfer plate is attached to the bus bar.

SUMMARY

As an electric current of an electric system increases, an amount of self-heating of the bus bar and an amount of heat received from an internal electric component to be connected increase. If the cooling of the bus bar is not actively performed, sizes of the bus bar and the internal electric component become larger due to an increase in size for heat diffusion, resulting in a larger unit size. Therefore, it is desired to effectively cool the bus bar.

When there are a plurality of bus bars, it is necessary to cool each bus bar in a well-balanced manner. When a cooling performance variation between the bus bars is large, the unit size is enlarged for heat diffusion according to the bus bar having the lowest cooling performance, resulting in a larger unit size. In this way, the unit size depends on the bus bar having the lowest cooling performance.

There is a need for a bus bar cooling structure capable of cooling a plurality of bus bars in a well-balanced manner while effectively cooling the bus bars.

According to one aspect of the present disclosure, there is provided a bus bar cooling structure including: a plurality of bus bars; and an insulating cooling portion provided so as to be in contact with a part of each of the plurality of bus bars, current paths of the plurality of bus bars having different length from start points to end points of the current paths, a contact area between each bus bar and the cooling portion being set to an area proportional to a length of the bus bar.

BRIEF DESCRIPTION OF THE DRAWINGS

FIG. 7 is a diagram illustrating a relationship between the number of bus bars and the current value in a structure in which a plurality of bus bars are stacked in the Z direction;

DETAILED DESCRIPTION

Hereinafter, a bus bar cooling structure according to an embodiment of the disclosure will be described in detail with reference to the drawings. The disclosure is not limited to the embodiments described below.

Figure 1:
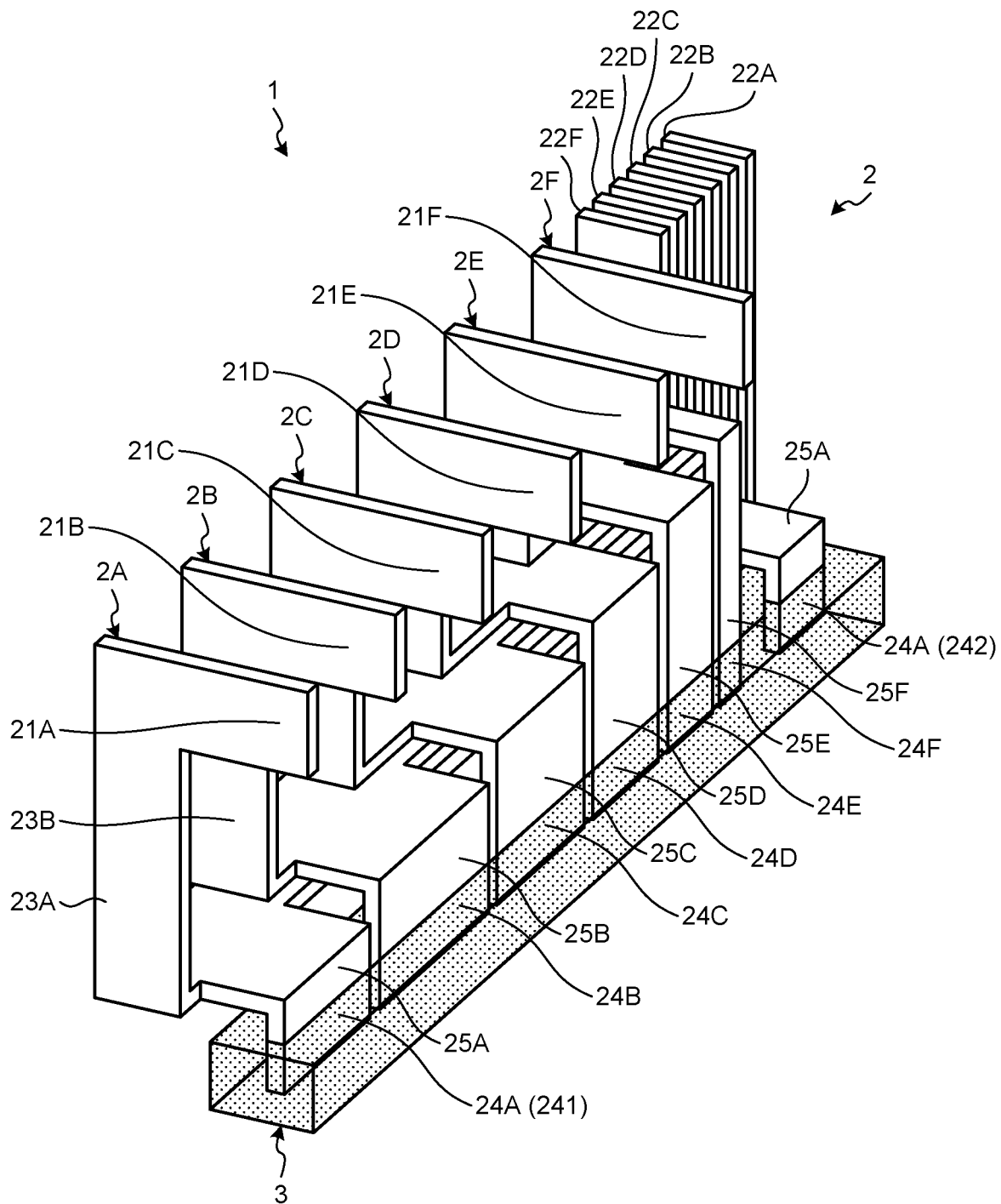
FIG. 1 is a perspective view illustrating a bus bar cooling structure according to an embodiment.
Figure 2:
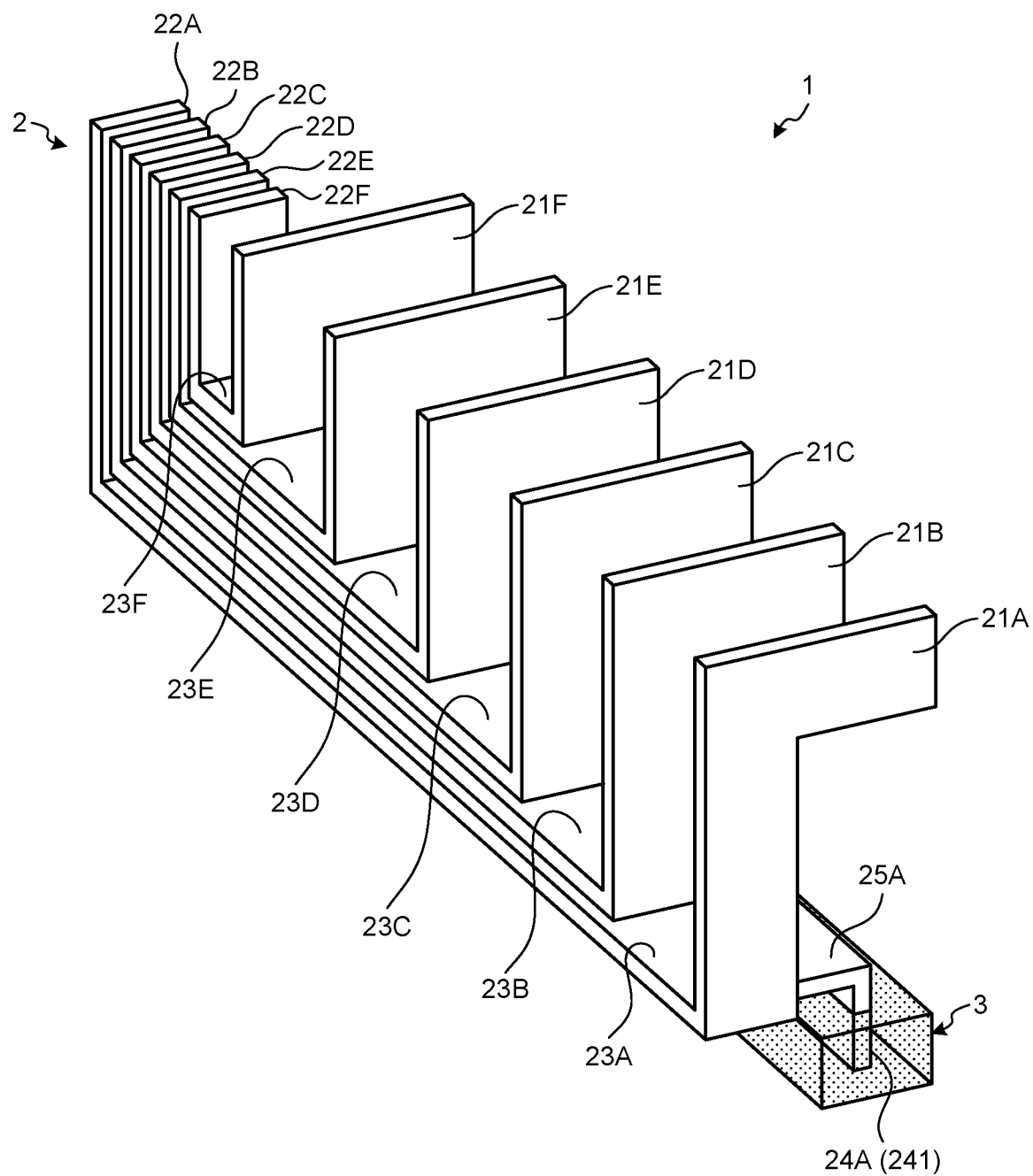
FIG. 2 is a perspective view of the bus bar cooling structure of FIG. 1 viewed from an opposite side.
Figure 3:
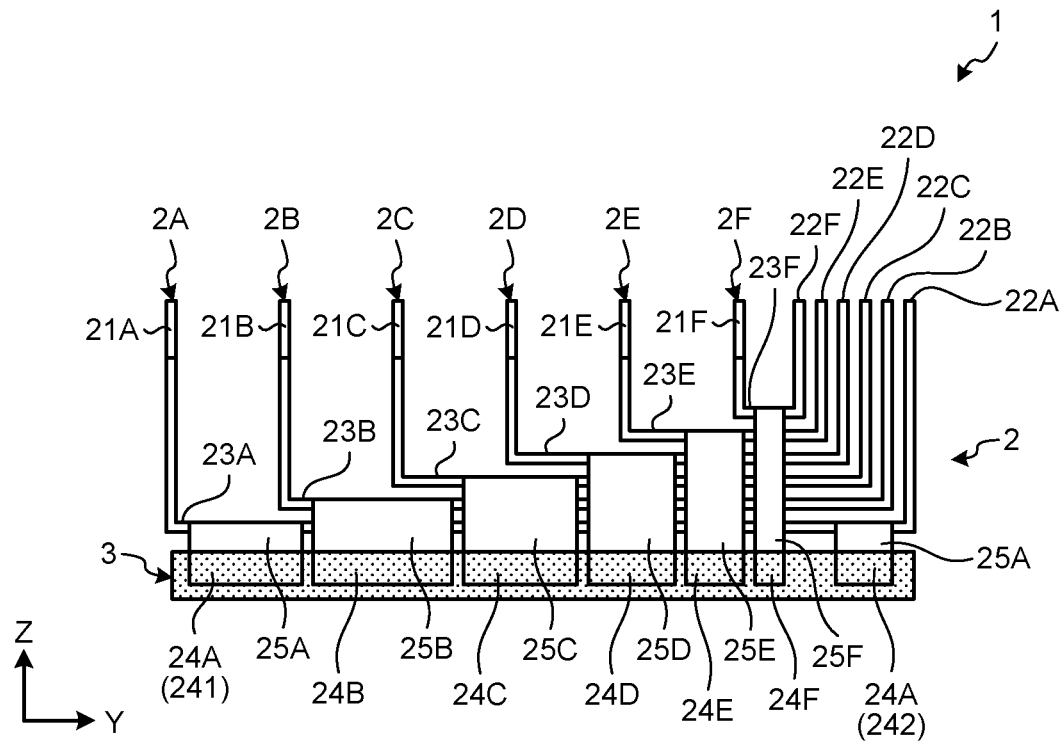
FIG. 3 is a side view of the bus bar cooling structure of FIG. 1 viewed from a X direction.
Figure 4:
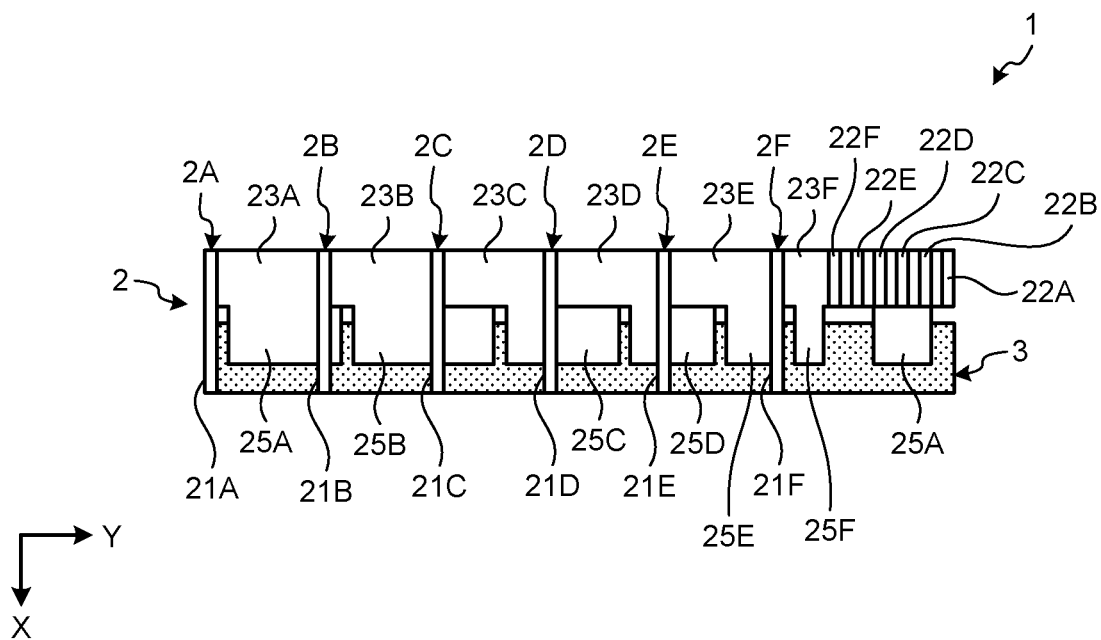
FIG. 4 is a top view of the bus bar cooling structure of FIG. 1 when viewed from a Z direction.

FIG. 1 is a diagram schematically illustrating a bus bar cooling structure according to the embodiment. FIG. 2 is a perspective view of the bus bar cooling structure of FIG. 1 viewed from an opposite side. FIG. 3 is a side view of the bus bar cooling structure of FIG. 1 viewed from a X direction. FIG. 4 is a top view of the bus bar cooling structure of FIG. 1 when viewed from a Z direction. In FIG. 1 to FIG. 4, an internal structure is illustrated in a transparent state. The X direction and a Y direction are orthogonal directions to each other. The Z direction is a direction perpendicular to a X-Y plane.

The bus bar cooling structure 1 cools a plurality of bus bars 2. The bus bar cooling structure 1 has a structure in which a part of each bus bar 2 is in contact with a heat conductive material 3. In the bus bar cooling structure 1, the heat of the bus bar 2 is transferred from the bus bar 2 to the heat conductive material 3, thereby cooling the bus bar 2.

The bus bar 2 is a plate-shaped conductive material. The bus bar 2 is made of a metal material such as aluminum, copper, nickel, or stainless steel. The bus bar 2 has an input-side connection portion (start point) connected to an input-side electrical component and an output-side connection portion (end point) connected to an output-side electrical component. The bus bar 2 electrically connects the electrical components to each other. A physical connection method (fastening method) between the bus bar 2 and the electrical component is not particularly limited.

For example, the bus bars 2 are included in an electric unit in which a plurality of electric components are unitized, and are housed in a unit case together with the electric components to which the bus bars 2 are connected. The unit case (hereinafter, simply referred to as a case) is a case that houses unitized electrical components. Within the case, a certain electrical component and another electrical component are electrically connected by the bus bars 2. When electrical power is supplied from one electrical component (input side) to another electrical component (output side) via the bus bars 2, a current path therebetween is branched by the plurality of bus bars 2 in order to allow a large current to flow between the electrical component and the other electrical component. That is, the bus bars 2 are bus bars through which a large current flows, and branched current paths including the plurality of bus bars 2 are formed.

The plurality of bus bars 2 includes six bus bars 2A, 2B, 2C, 2D, 2E, 2F having different lengths. This length (bus bar length) is a distance from a start point 21 to an end point 22 of the current path. The start point 21 is a portion connected to the input-side electrical component. The end point 22 is a portion connected to the output-side electrical component. The plurality of bus bars 2, as illustrated in FIG. 1, include the first bus bar 2A, the second bus bar 2B, the third bus bar 2C, the fourth bus bar 2D, the fifth bus bar 2E, and the sixth bus bar 2F, the first bus bar 2A to the sixth bus bar 2F being shorter in length from the start point 21 to the end point 22 of the current path in this order.

The first bus bar 2A has a start point 21A which is the input-side connection portion and an end point 22A which is the output-side connection portion, and is formed in a shape having a longest distance from the start point 21A to the end point 22A of the current path. The first bus bar 2A electrically connects the electrical components and forms a current path between the electrical components from the start point 21A to the end point 22A.

The second bus bar 2B has a start point 21B that is the input-side connection portion and an end point 22B that is the output-side connection portion, and is formed to have a second longest length from the start point 21B to the end point 22B of the current path. The second bus bar 2B electrically connects the electrical components and forms a current path between the electrical components from the start point 21B to the end point 22B.

The third bus bar 2C has a start point 21C which is the input-side connection portion and an end point 22C which is the output-side connection portion, and is formed in a third longest shape from the start point 21C to the end point 22C of the current path. The third bus bar 2C electrically connects the electrical components to each other and forms a current path between the electrical components from the start point 21C to the end point 22C.

The fourth bus bar 2D has a start point 21D which is the input-side connection portion and an end point 22D which is the output-side connection portion, and is formed in a fourth longest shape from the start point 21D to the end point 22D of the current path. The fourth bus bar 2D electrically connects the electrical components to each other, and forms a current path between the electrical components from the start point 21D to the end point 22D.

The fifth bus bar 2E has a start point 21E which is the input-side connection portion and an end point 22E which is the output-side connection portion, and is formed in a fifth longest shape from the start point 21E to the end point 22E of the current path. The fifth bus bar 2E electrically connects the electrical components to each other and forms a current path between the electrical components from the start point 21E to the end point 22E.

The sixth bus bar 2F has a start point 21F which is the input-side connection portion and an end point 22F which is the output-side connection portion, and is formed in a shape having a sixth longest distance from the start point 21F to the end point 22F of the current path, that is, the shortest shape. The sixth bus bar 2F electrically connects the electrical components to each other, and forms a current path between the electrical components from the start point 21F to the end point 22F.

The first bus bar 2A to the sixth bus bar 2F are connected to the same input-side electrical component (first electrical component) and the same output-side electrical component (second electrical component). The first bus bar 2A to the sixth bus bar 2F are connected to form six current paths between the first electrical component and the second electrical component. For example, the bus bar cooling structure 1 can be applied to a step-up converter, and a reactor provided on an input-side and a power module provided on an output-side are electrically connected by the first bus bar 2A to the sixth bus bar 2F. In this case, a unit is a step-up converter unit (step-up DC/DC converter), and the case is a converter case that houses the step-up converter unit. The unit can be mounted on a vehicle.

Each of the bus bars 2 is erected from the heat conductive material 3 in a state of being partially embedded in the heat conductive material 3.

The heat conductive material 3 is a material having high thermal conductivity and high insulating property. The heat conductive material 3 is an insulating cooling portion formed of a material (high heat conductive material) having higher heat conductivity than the bus bar 2. The heat conductive material 3 functions as a cooling portion that cools the bus bars 2 by receiving heat from the bus bars 2.

The heat conductive material 3 is formed in a rectangular parallelepiped shape. The heat conductive material 3 extends along the Y-direction with the X-direction as a short-side direction, the Y-direction as a longitudinal direction, and the Z-direction as a height direction.

For example, the heat conductive material 3 is accommodated in the case in a state of being in close contact with an inner surface of the case. The heat conductive material 3 forms a heat path for transferring heat of the bus bar 2 from the heat conductive material 3 to the case. The case functions as a heat dissipation unit that dissipates the heat of the bus bar 2. As an example, when the bus bar 2 is made of copper and the case is made of aluminum, the heat conductive material 3 is made of a material having a higher thermal conductivity than copper. Since the heat conductive material 3 has a high insulating property, the bus bar 2 and the case are prevented from being short-circuited.

In the bus bar cooling structure 1, the heat of each bus bar 2 is directly transmitted to the heat conductive material 3. Each bus bar 2 includes a portion that contacts the heat conductive material 3 and directly transmits the heat of the bus bar 2 to the heat conductive material 3.

Specifically, the bus bar 2 includes the start point 21, the end point 22, a current-carrying portion 23, a heat transfer portion 24, and a branching portion 25. The bus bar 2 is formed of a plate-shaped material having a thickness of 2 mm.

In this explanation, when the start points 21A, 21B, 21C, 21D, 21E, 21F are not particularly distinguished, the suffixes A to F are omitted and are referred to as the start points 21. Similarly, the subscripts A to F may be omitted for the end points 22, the current-carrying portions 23, the heat transfer portions 24, and the branching portions 25.

The current-carrying portion 23 is a portion that forms the current path of the bus bar 2, and forms a portion from the start point 21 to the end point 22 of the current path. The start point 21, the end point 22, and the current-carrying portion 23 are disposed at positions higher in the Z direction than a position at which the heat conductive material 3 is disposed, and are not in contact with the heat conductive material 3. In the Y direction, the start point 21 is arranged on one side and the end point 22 is arranged on the other side. The current-carrying portion 23 extends along the Y direction so as to connect the start point 21 and the end point 22. The current-carrying portion 23 is formed to have a thickness of 2 mm and a width of 22 mm.

As illustrated in FIG. 2, the current-carrying portions 23 are stacked in the Z-direction. The current-carrying portion 23 has a first portion on a side of the start point 21 disposed on one side in the Y direction, a second portion on a side of the end point 22 disposed on the other side in the Y direction, and an intermediate portion extending along the Y direction so as to connect the first portion and the second portion. In the plurality of bus bars 2, the current-carrying portions 23 are stacked in the Z direction, and the intermediate portions of the current-carrying portions 23 are stacked in the Z direction. The first portions and the second portions of the current-carrying portions 23 are stacked in the Y direction.

The heat transfer portion 24 is a portion that directly transfers the heat of the bus bar 2 to the heat conductive material 3. A surface of the heat transfer portion 24 is in contact with the heat conductive material 3 while the heat transfer portion 24 is embedded in the heat conductive material 3. The surface of the heat transfer portion 24 and a surface of the heat conductive material 3 are in surface contact (close contact). The heat transfer portion 24 is a distal end portion of the branching portion 25 branched from the current-carrying portion 23, and thus is not included in the current path. The heat transfer portion 24 is formed to have the same thickness 2 mm as the current-carrying portion 23, but the width thereof may not be formed to have the same width as the current-carrying portion 23. The width of the heat transfer portion 24 is set depending on the length of each bus bar 2.

The branching portion 25 is a portion that branches from the current-carrying portion 23 and reaches the heat transfer portion 24. As illustrated in FIG. 1, the branching portion 25 is erected from the heat conductive material 3 in the Z direction. The branching portion 25 is branched from the current-carrying portion 23, and thus is not included in the current path. The branching portion 25 functions as a heat conductive portion that transmits the heat of the current-carrying portion 23 to the heat transfer portion 24. The heat of the current-carrying portion 23 is thermally transferred to the heat transfer portion 24 via the branching portion 25, and is thermally transferred from the heat transfer portion 24 to the heat conductive material 3. The branching portion 25 is formed to have the same thickness 2 mm as the current-carrying portion 23, and to have the same width as the heat transfer portion 24.

Each of the bus bars 2 configured as described above transmits heat from the heat transfer portion 24 to the heat conductive material 3. At this time, the heat generated in the bus bar itself at the time of energization and the heat received from the electrical component to which the start point 21 or the end point 22 is fastened is transmitted from each bus bar 2 to the heat conductive material 3. In the bus bar cooling structure 1, in order to cool six bus bars 2A, 2B, 2C, 2D, 2E, 2F, which have different lengths, in a well-balanced manner, an area (contact area or cooling area) in which the bus bar 2 and the heat conductive material 3 are in contact with each other is set depending on the length of the bus bar 2.

Figure 5:
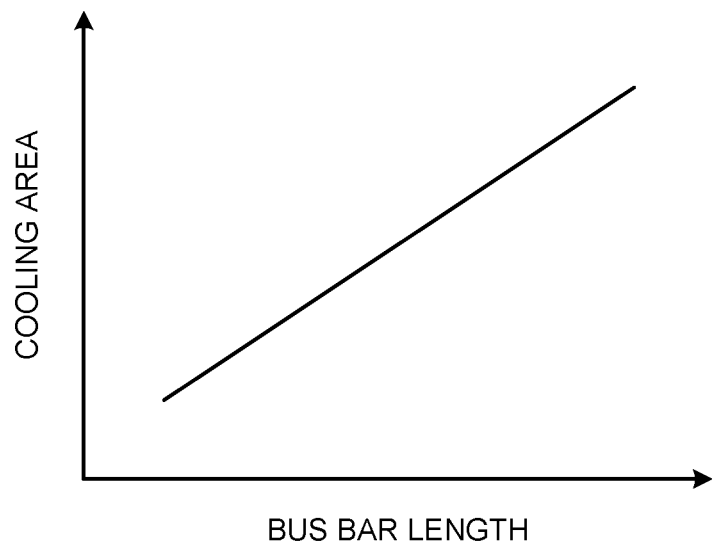
FIG. 5 is a diagram illustrating a relationship between a length and a cooling area of a bus bar.

Specifically, in the bus bar 2, an amount of heat generated by the bus bar itself (the self-heating amount) is represented by a loss during energization, that is, $RI^2$. R is an electric resistance value of the bus bar 2, and I is a value of a current flowing through the bus bar 2. When each of cross-sectional areas of the current paths in the bus bars 2 is formed to have the same size, the loss during energization in each bus bar 2 is proportional to a length of the current path of each bus bar 2 (bus bar length is proportional to R). An amount of heat dissipation of each bus bar 2 is proportional to the contact area in which the bus bar 2 and the heat conductive material 3 are in contact with each other (amount of heat dissipation is proportional to area). Therefore, in the bus bar cooling structure 1, as illustrated in FIG. 5, the cooling area of each bus bar 2 is set to an area proportional to the distance (bus bar length) from the start point 21 to the end point 22 of each bus bar 2.

The cooling area of the bus bar 2 is an area (contact area) where the heat transfer portion 24 is in contact with the heat conductive material 3. In the plurality of bus bars 2, the branching portions 25 are erected from the heat conductive material 3 in a state in which the heat transfer portions 24 are arranged side by side in the longitudinal direction (Y direction) of the heat conductive material 3. Each of the heat transfer portions 24 is disposed at the same position in the short-side direction (X direction) of the heat conductive material 3. The heat transfer portions 24A, 24B, 24C, 24D, 24E, 24F of the bus bars 2 are formed to have the same thickness and are embedded in the heat conductive material 3 at the same depth. That is, the size of the cooling area of the bus bar 2 is defined by the width of the heat transfer portion 24. In the plurality of bus bars 2, although the respective current-carrying portions 23 is formed to have the same width, since the heat transfer portions 24 are portions branched from the current-carrying portions 23, the respective heat transfer portions 24 can be formed to have a different width from the width of the corresponding current-carrying portion 23.

As illustrated in FIGS. 1 and 3, the cooling area of the first bus bar 2A is an area where the heat transfer portion 24A is in contact with the heat conductive material 3. The heat transfer portion 24A is formed to be the widest. The heat transfer portion 24A is formed by two portions. The heat transfer portion 24A includes a first contact portion 241, which is a portion disposed on one side in the Y direction, and a second contact portion 242, which is a portion disposed on another side in the Y direction. The cooling area of the first bus bar 2A is an area obtained by adding an area where the first contact portion 241 is in contact with the heat conductive material 3 and an area where the second contact portion 242 is in contact with the heat conductive material 3.

As illustrated in FIGS. 1 and 3, the cooling area of the second bus bar 2B is an area where the heat transfer portion 24B is in contact with the heat conductive material 3. The heat transfer portion 24B is formed to be the second widest.

As illustrated in FIGS. 1 and 3, the cooling area of the third bus bar 2C is an area where the heat transfer portion 24C is in contact with the heat conductive material 3. The heat transfer portion 24C is formed to be the third widest.

As illustrated in FIGS. 1 and 3, the cooling area of the fourth bus bar 2D is an area where the heat transfer portion 24D is in contact with the heat conductive material 3. The heat transfer portion 24D is formed to be the fourth widest.

As illustrated in FIGS. 1 and 3, the cooling area of the fifth bus bar 2E is an area where the heat transfer portion 24E is in contact with the heat conductive material 3. The heat transfer portion 24E is formed to be the fifth widest.

As illustrated in FIGS. 1 and 3, the cooling area of the sixth bus bar 2F is an area where the heat transfer portion 24F is in contact with the heat conductive material 3. The heat transfer portion 24F is formed to be the sixth widest, that is, the narrowest in width.

According to the bus bar cooling structure 1 configured as described above, by setting the cooling area of each bus bar 2 to a size proportional to the length of the current path, it is possible to suppress the cooling performance variation between the bus bars 2 due to the difference in the length.

Figure 6:
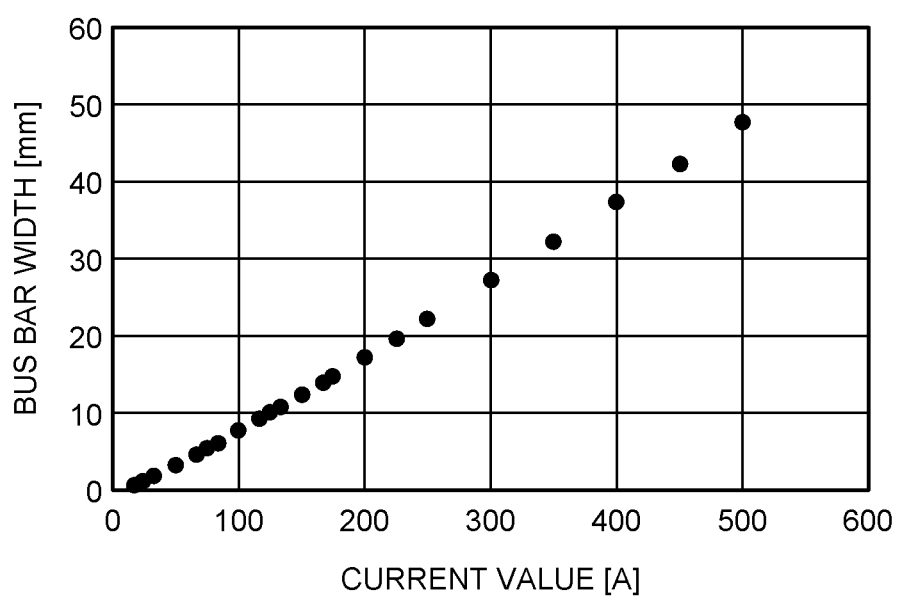
FIG. 6 is a diagram illustrating a relationship between a bus bar width and a current value.
Figure 8:
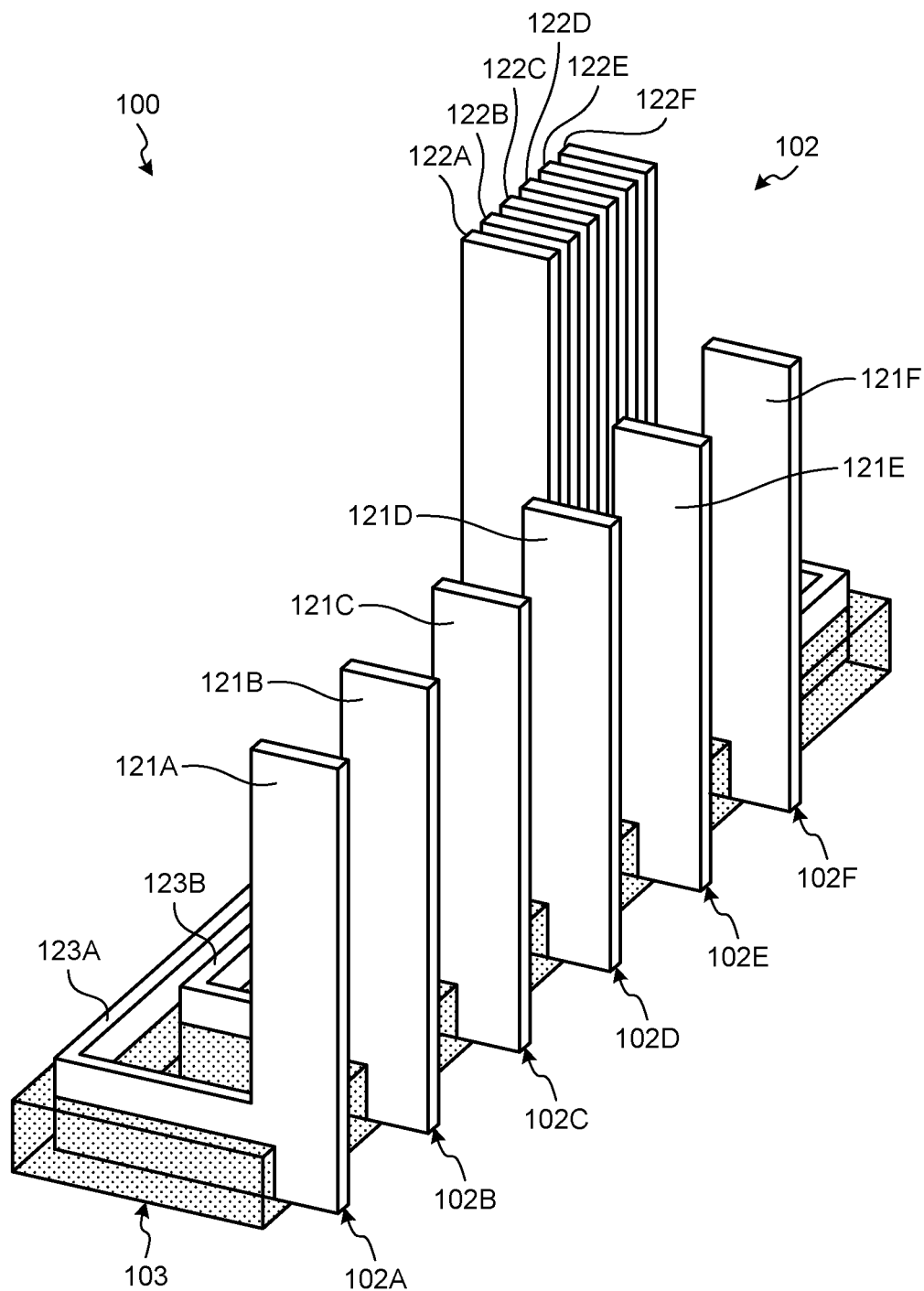
FIG. 8 is a perspective view schematically showing a bus bar cooling structure of a comparative example.
Figure 9:
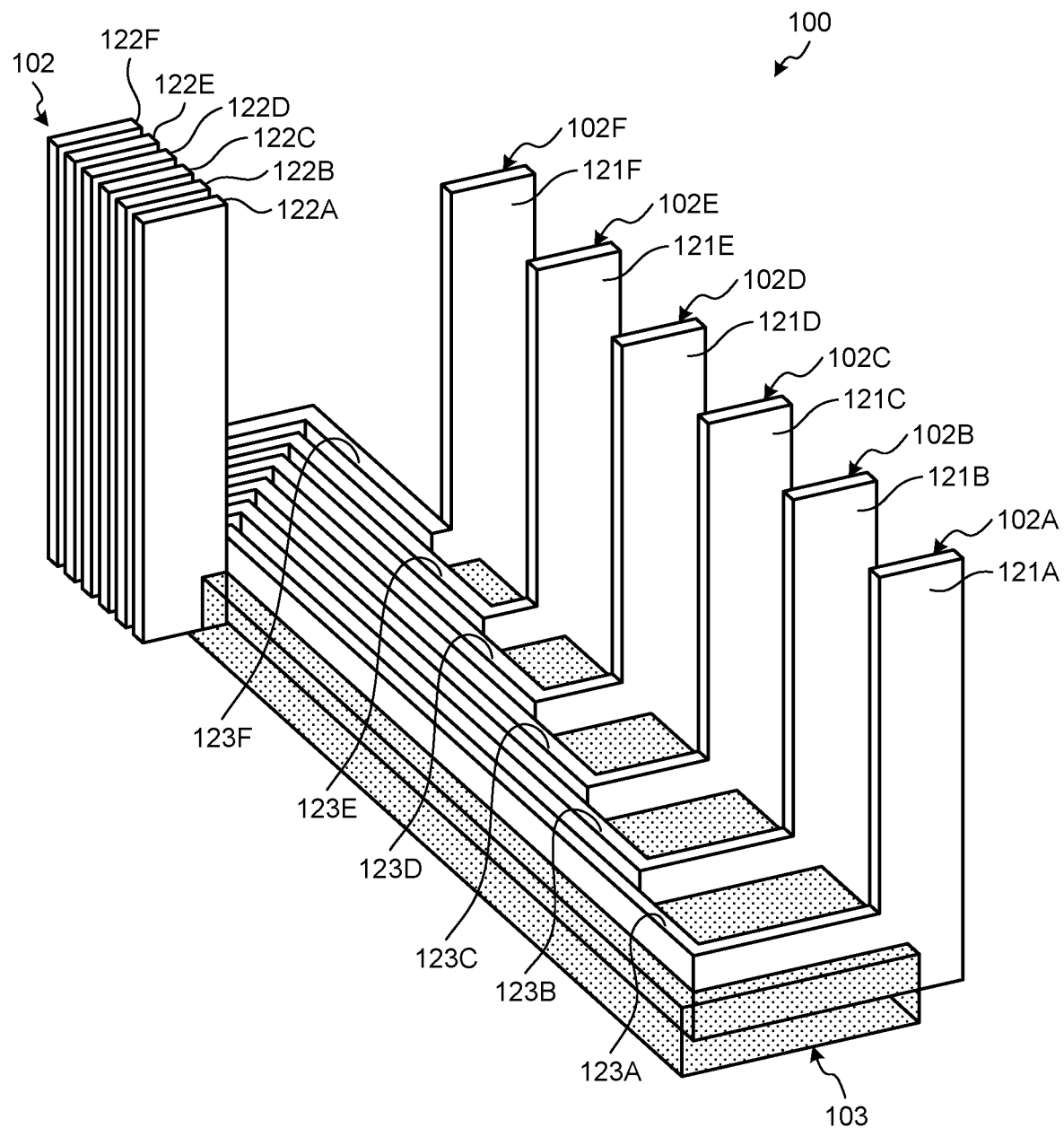
FIG. 9 is a perspective view of the bus bar cooling structure of FIG. 8 when viewed from an opposite side.

FIG. 6 is a diagram illustrating a relationship between a bus bar width and a current value. FIG. 7 is a diagram illustrating a relationship between the number of bus bars and the current value in a structure in which a plurality of bus bars are stacked in the Z direction. FIG. 6 illustrates an embodiment in which the thickness of the bus bar is set to 2 mm and the width of the bus bar is changed.

The relationship between the current value and the bus bar width (bus bar cross-sectional area) illustrated in FIG. 6 is represented by Melson & Booth relational expression. FIG. 6 illustrates the bus bar width (bus bar cross-sectional area) required to flow the current at that current value. In other words, the allowable current value corresponding to the bus bar width is illustrated. For example, when a 100A current flows, the bus bar width of 9 mm is required.

FIG. 7 illustrates that a structure in which a plurality of bus bars are stacked in the Z direction is excellent in compactness. The relationship between the current value and the number of bus bars illustrated in FIG. 7 indicates that, in a structure in which a plurality of bus bars are stacked in the Z direction, the more the current value and the number of bus bars increase (the lower right direction in the diagram illustrated in FIG. 7), the more compact the size of the structure becomes. As illustrated in FIG. 7, when the current value is 100 A, a structure in which two bus bars are stacked in the Z direction becomes smaller in size than a structure in which the two bus bars are stacked in the X direction or Y direction. Similarly, when the current value is in a range of 100 A to 600 A, a structure in which four bus bars are stacked in the Z direction becomes smaller in size than a structure in which the four bus bars are stacked in the X direction or the Y direction. When the current value is in a range of 100 A to 1000 A, a structure in which six bus bars are stacked in the Z direction becomes smaller in size than a structure in which the six bus bars are stacked in the X direction or the Y direction. For example, when the current value is 900 A, the current of 900 A is branched such that it flows through six bus bars 2A, 2B, 2C, 2D, 2E, 2F, so the current value per bus bar becomes 150 A, if the current-carrying portion 23 of the bus bar 2 has the width of 22 mm, as illustrated in FIG. 6, it will be within the allowable current value.

As described above, the bus bar cooling structure 1 in which the six bus bar 2A, 2B, 2C, 2D, 2E, 2F are stacked in the Z direction can be made smaller in size than the bus bar cooling structure in which the plurality of bus bars are stacked in the X direction or the Y direction. As a comparative example, FIG. 8 to FIG. 11 illustrate a bus bar cooling structure 100 in which a plurality of bus bars are stacked in the X direction.

As illustrated in FIGS. 8 to 11, the bus bar cooling structure 100 of the comparative example has a structure in which a plurality of bus bars 102 are stacked in the X direction, and is configured to cool each bus bar 102 by the heat conductive material 103. The plurality of bus bars 102 include a first bus bar 102A, a second bus bar 102B, a third bus bar 102C, a fourth bus bar 102D, a fifth bus bar 102E, and a sixth bus bar 102F, the first bus bar 102A to the sixth bus bar 102F being shorter in length from a start point 121 to an end point 122 of a current path in this order.

The bus bar 102 includes the start point 121, the end point 122, and a current-carrying portion 123.

In this explanation, when the start points 121A, 121B, 121C, 121D, 121E, 121F are not particularly distinguished, the suffixes A to F are omitted and are referred to as the start points 121. Similarly, the subscripts A to F may be omitted for the end points 122 and the current-carrying portions 123.

Figure 10:
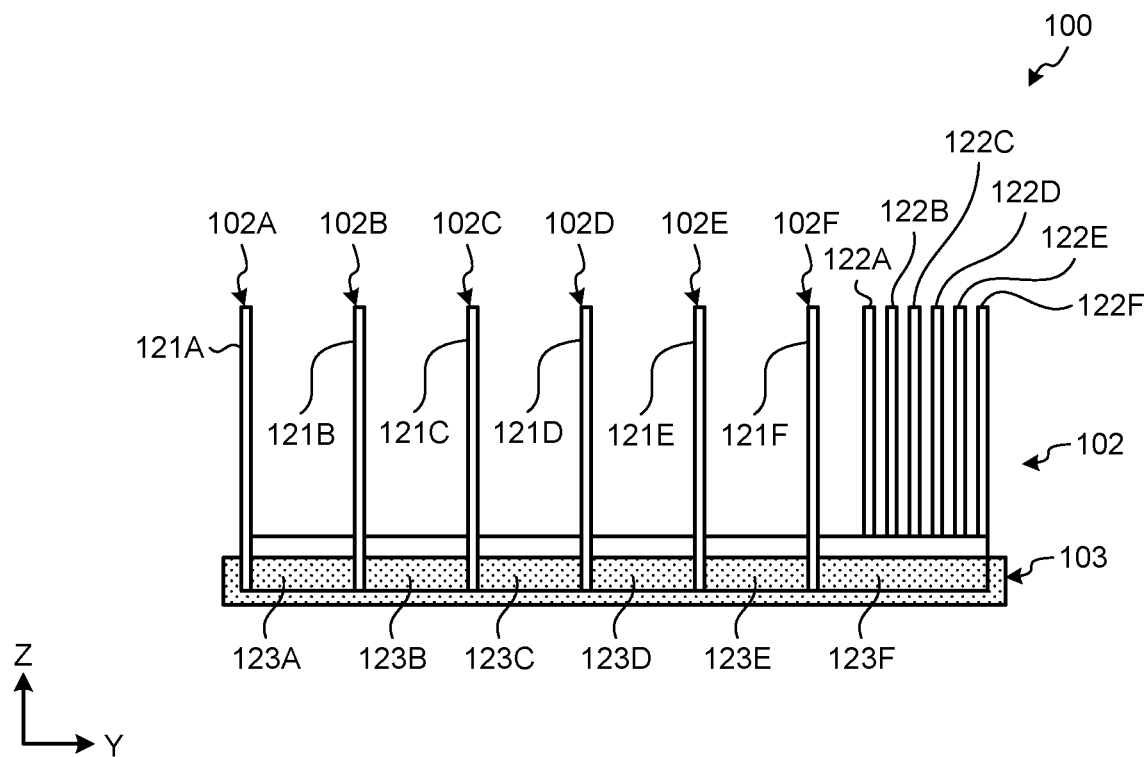
FIG. 10 is a side view of the bus bar cooling structure of FIG. 8 viewed from a X direction.
Figure 11:
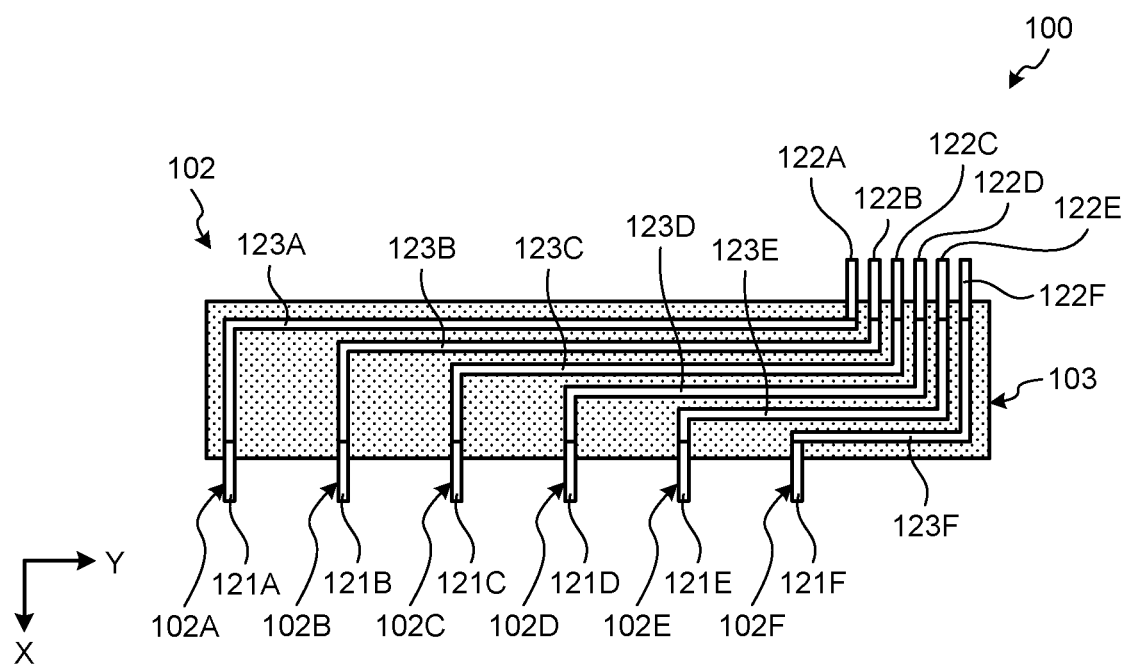
FIG. 11 is a top view of the bus bar cooling structure of FIG. 8 when viewed from a Z direction.

The current-carrying portions 123 are stacked in the X direction in a state where at least a part of each of the current-carrying portions 123 is embedded in the heat conductive material 103. That is, the current-carrying portions 123 are portions that form current paths of the bus bars 102 and portions that directly transmit heat of the bus bars 102 to the heat conductive material 103. As illustrated in FIG. 10, since the current-carrying portions 123 are embedded in the heat conductive material 103 at the same depth, a size of a cooling area of each bus bar 102 is defined by a length of the current-carrying portion 123 embedded in the heat conductive material 103, as shown in FIG. 11. Therefore, the cooling areas of the bus bars 102 decrease in the order from the first bus bar 102A to the sixth bus bar 102F.

Figure 12:
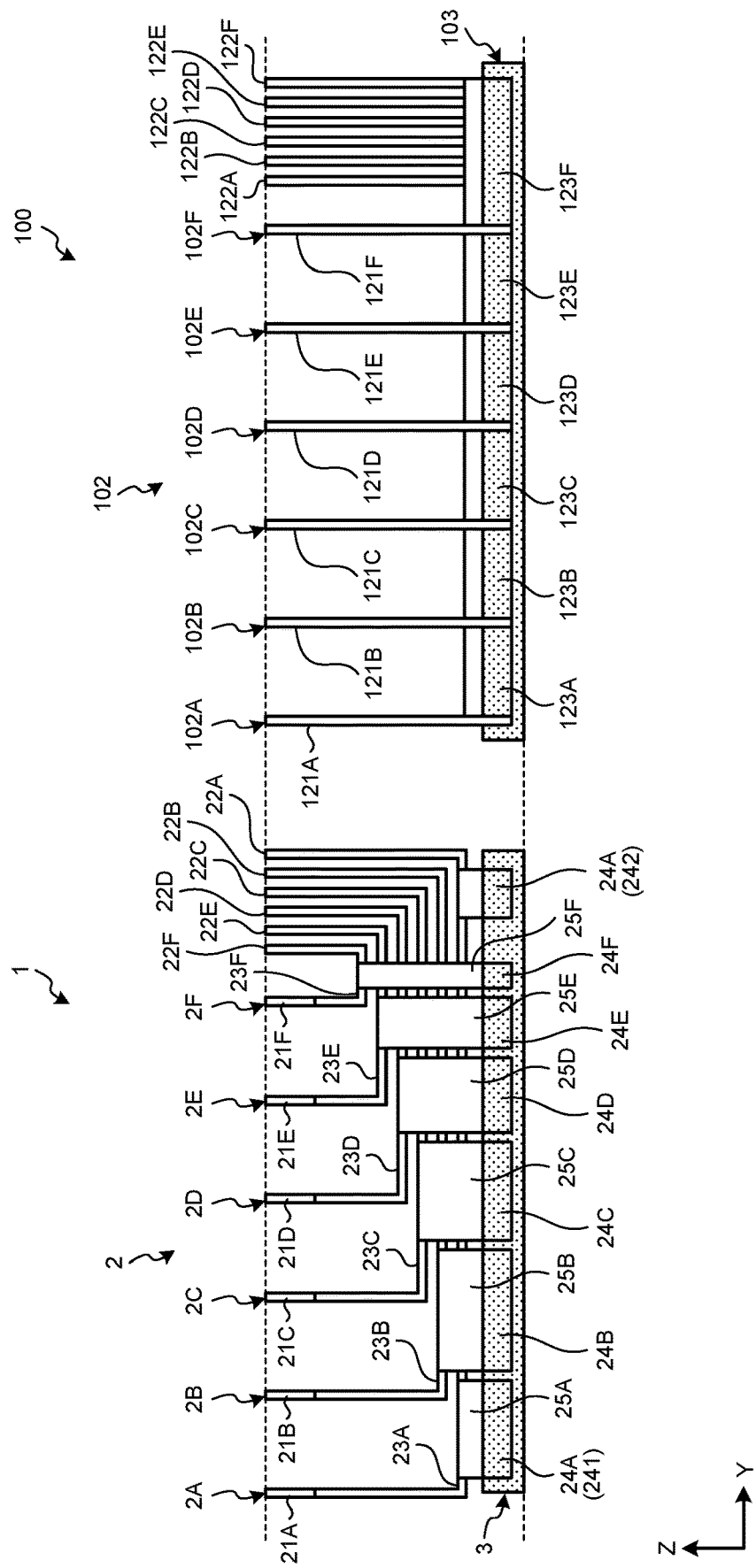
FIG. 12 is a side view for comparative and explaining sizes of the bus bar cooling structures in the Z direction.
Figure 13:
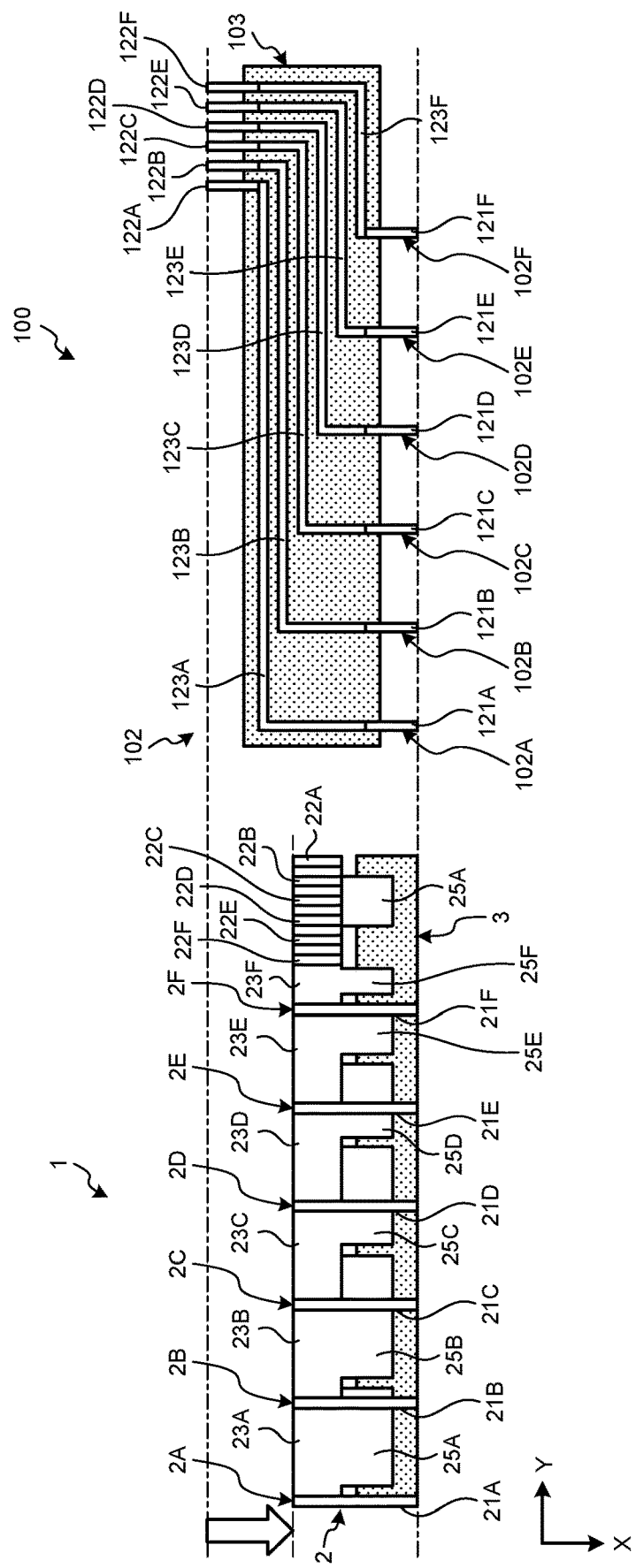
FIG. 13 is a top view for comparative and explaining the sizes of the bus bar cooling structures in the X direction.

FIG. 12 is a side view for comparative and explaining the size of the bus bar cooling structure in the Z direction. FIG. 13 is a top view for comparative and explaining the size of the bus bar cooling structure in the X direction.

As illustrated in FIG. 12, the bus bar cooling structure 1 and the bus bar cooling structure 100 have the same size in the Z direction. On the other hand, as illustrated in FIG. 13, the bus bar cooling structure 1 is smaller in size in the X direction than the bus bar cooling structure 100. As described above, the structure in which the plurality of bus bars 2 are stacked in the Z direction can be made more compact than the structure in which the plurality of bus bars 102 are stacked in the X direction. In the case, a space in an upper part of the bus bars 2 (Z direction) is less effectively utilized by other parts, and therefore, by effectively utilizing the space, it is possible to save the space of the entire unit.

As described above, according to the embodiment, the cooling performance is improved by embedding the heat transfer portions 24 of the bus bars 2 in the heat conductive material 3. Further, since the cooling area of each bus bar 2 is set to a size corresponding to the bus bar length, it is possible to suppress cooling performance variation between the bus bars 2 due to differences in lengths of the bus bars 2. As a result, it is possible to effectively cool the bus bars 2 having different lengths, and it is possible to suppress the cooling performance variation between the bus bars 2. As a result, in the structure including the bus bars 2, it is possible to achieve both space saving and suppression of a cooling performance variation between the bus bars 2.

Since the bus bar cooling structure 1 can cool the plurality of bus bars 2 having different lengths, the combination of the lengths and the number of the bus bars 2 are not particularly limited. At least two bus bars of the plurality of bus bars 2 need only be formed to have different lengths, and not all the bus bars need to be formed to have different lengths.

The thickness of the bus bar 2 is not limited to 2 mm. For example, the bus bar 2 may be formed to have a thickness of 2 mm to 5 mm. Similarly, the current-carrying portion 23 of the bus bar 2 is not limited to 22 mm.

In addition, although an example in which the unit including the bus bar cooling structure 1 is mounted on the vehicle has been described, in this case, the X direction may be a vehicle width direction, the Y direction may be a vehicle front-rear direction, and the Z direction may be a height direction.

Further, although the bus bar cooling structure 1 has been described as an example applied to the step-up converter, the disclosure is not limited thereto. The bus bar cooling structure 1 is effectively applicable in a mechanism in which a plurality of bus bars are included due to thermal constraints of the bus bars themselves or electrical parts to be connected according to an increase in an output (increase in current) of a system. In short, the larger the current and the larger the number of bus bars, the more advantageous the bus bar cooling structure 1 is.

Further, the bus bar 2 is not limited to a bar formed of a single plate-shaped material, and may be formed by joining a plurality of plate-shaped materials. For example, the current-carrying portion 23 may be formed by connecting two plate-shaped materials.

According to the disclosure, since a cooling area of each of a plurality of bus bars having different lengths has a size proportional to a length of the bus bars, it is possible to suppress a cooling performance variation between the bus bars when cooling the bus bars. As a result, the plurality of bus bars can be cooled in a well-balanced manner while the bus bars are effectively cooled.

Further, according to the disclosure, a part of the bus bar is embedded in the heat conductive material, so that the cooling performance of the bus bar is improved.

According to the disclosure, heat can be dissipated by a portion branched from the current path.

According to the disclosure, by stacking the plurality of bus bars in the erecting direction, space can be effectively utilized, and space saving can be achieved. This makes it possible to reduce the size of the unit.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A bus bar cooling structure, comprising:
   a plurality of bus bars, each bus bar including
      a current-carrying portion that forms a portion from a start point to an end point of a current path, and
      a heat transfer portion that is not included in the current path; and
   an insulating cooling portion in which only the heat transfer portion of each bus bar is embedded, the insulating cooling portion being provided so as to be in contact with the heat transfer portion,
   current paths of the plurality of bus bars having different length lengths from start points to end points of the current paths,
   a contact area between the heat transfer portion of each bus bar and the cooling portion being set to an area proportional to a length of the bus bar.

2. The bus bar cooling structure according to claim 1, wherein
   the cooling portion is a heat conductive material having a thermal conductivity higher than a thermal conductivity of the bus bar,
   each bus bar protrudes from the heat conductive material in a state in which the heat transfer portion of the bus bar is embedded in the heat conductive material, and
   current-carrying portions of the plurality of bus bars are stacked in a protruding direction in which each bas bar protrudes from the heat conductive material.

3. The bus bar cooling structure according to claim 2, wherein
   each bas bar further includes
      a branching portion branching from the current-carrying portion and reaching the heat transfer portion.

4. The bus bar cooling structure according to claim 3, wherein
   the heat conductive material is formed in a rectangular parallelepiped shape,
   in the plurality of bus bars, branching portions are erected from the heat conductive material in the protruding direction in a state in which heat transfer portions of the plurality of bus bars are arranged side by side in a longitudinal direction of the heat conductive material.

5. The bus bar cooling structure according to claim 2, wherein
   the current-carrying portions of the plurality of bus bars are stacked in a direction away from the heat conductive material as the lengths of the current paths of the plurality of bus bars decrease.

6. The bus bar cooling structure according to claim 5, wherein
   each bus bar further includes
      a branching portion branching from the current-carrying portion and reaching the heat transfer portion.

7. The bus bar cooling structure according to claim 6, wherein
   the heat conductive material is formed in a rectangular parallelepiped shape, and
   in the plurality of bus bars, branching portions are erected from the heat conductive material in the protruding direction in a state in which heat transfer portions of the plurality of bus bars are arranged side by side in a longitudinal direction of the heat conductive material.

* * * * *